United States Patent [19]

Yamazaki et al.

[11] Patent Number: 4,986,213

[45] Date of Patent: Jan. 22, 1991

[54] SEMICONDUCTOR MANUFACTURING DEVICE

[75] Inventors: Shunpei Yamazaki, Tokyo; Kunio Suzuki, Atsugi; Susumu Nagayama, Tokyo; Takashi Inujima, Atsugi; Masayoshi Abe, Tokyo; Takeshi Fukada, Ebina; Mikio Kinka, Atsugi; Ippei Kobayashi, Atsugi; Katsuhiko Shibata, Atsugi; Masato Susukida, Atsugi; Kaoru Koyanagi, Saku, all of Japan

[73] Assignee: Semiconductor Energy Laboratory Co., Ltd., Kanagawa, Japan

[21] Appl. No.: 251,940

[22] Filed: Sep. 28, 1988

Related U.S. Application Data

[63] Continuation of Ser. No. 891,791, Aug. 1, 1986, abandoned.

[30] Foreign Application Priority Data

Aug. 2, 1985 [JP] Japan .................... 60-170956
Aug. 23, 1985 [JP] Japan .................... 60-186372

[51] Int. Cl.$^5$ .................... C23C 16/48; C23C 16/50
[52] U.S. Cl. .................... 118/719; 118/722; 118/725; 118/50.1
[58] Field of Search .............. 118/719, 722, 725, 50.1; 437/173, 174

[56] References Cited

U.S. PATENT DOCUMENTS

| 4,313,783 | 2/1982 | Davies | 156/345 |
|---|---|---|---|
| 4,398,343 | 8/1983 | Yamazaki | 437/174 |
| 4,405,435 | 9/1983 | Tateishi | 204/298 |
| 4,482,395 | 11/1984 | Hiramoto | 437/174 |
| 4,498,416 | 2/1985 | Bouchaib | 118/719 |
| 4,503,807 | 3/1985 | Nakayama | 118/733 |
| 4,582,720 | 4/1986 | Yamazaki | 118/723 |
| 4,592,306 | 6/1986 | Gallego | 118/729 |
| 4,592,799 | 6/1986 | Hayafuji | 437/173 |
| 4,640,223 | 2/1987 | Dozier | 118/719 |
| 4,694,143 | 9/1987 | Nishimura | 118/725 |
| 4,698,486 | 10/1987 | Sheets | 118/725 |
| 4,699,863 | 10/1987 | Sawatari | 430/97 |

OTHER PUBLICATIONS

Kuwano, Photovoltaic Behavior of Amorphous Si:H and Si:F:H Solar Cells, Conference Record, 15th IEEE Photovoltaic Specialists Conf., Kissimmee, Fla, May 12-15, 1981, Published Aug. 1981, pp. 698-703.

*Primary Examiner*—Richard Bueker
*Attorney, Agent, or Firm*—Sixbey, Friedman, Leedom & Ferguson

[57] ABSTRACT

An improved semiconductor processing is desclosed. In the manufacturing process, just formed semiconductor layer undergoes photo annealing and latent dangling bonds are let appear on the surface and gaps, then neutralizer is introduced to the ambience of the semiconductor. The semiconductor thus formed demonstrates SEL effect in place of Staebler-Wronski effect.

5 Claims, 7 Drawing Sheets

SEMICONDUCTOR MANUFACTURING DEVICE

This appliation is a continuation of serial number 891,791, filed 8/1/86 now abandoned.

BACKGROUND OF THE INVENTION

1. Field of the Invention

The invention relates to an improved semiconductor manufacturing device in which SEL(State Exited by Light) effect can be enjoyed.

2. Prior Art

There have been known processing techniques for semiconductor devices comprising a substrate and non-monocrystalline semiconductor layer formed on the substrate. In many products according to such techniques, some undesirable effects are observed. Namely, immediately after fablication, a highly purified semiconductor exhibits decrease of conductivity under photo annealing in atmospheric air whereas it recovers by virtue of thermal annealing. The effect appears repeatedly. The inventors have found that such a phenomenon, called Staebler-Wronski effect, is observed only on semiconductors taken out from a vacuum chamber and made in contact with atmosphere.

Not only does repetition of increase and decrease in conductivity occur, but the conductivity tends to gradually decrease as with repetition of the Staebler-Wronski effect. This is undesirable, especially in semiconductors applied to solar cells.

SUMMARY OF THE INVENTION

An object of the invention is to produce improved semiconductors which are thermally and optically stable.

Another object of the invention is to produce improved semiconductors on which is unlikely generation of dangling bonds.

Further object of the invention is to provide an improved semiconductor layer which is not be degraduated even under repetition of Staebler-Wronski effect.

DETAILED DESCRIPTION OF THE PREFERRED EMBODIMENTS

Figure 1:
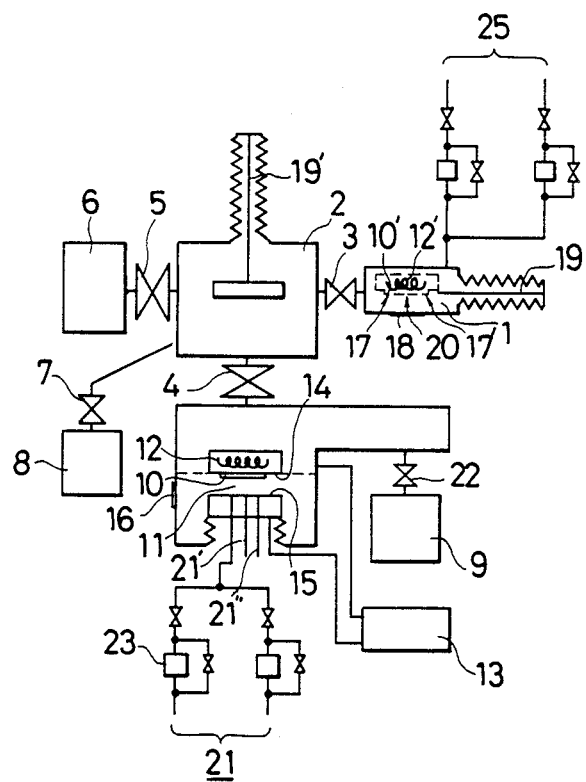
FIG. 1 is a schematic view of a plasma vapour reactor as an embodiment of the invention.

Referring to FIG. 1, an embodiment equipped with an ultra high vacuum apparatus according to the invention is shown. In the figure, a substrate 10' made of artificial quartz is placed below a heater 12' in a first pre-stage chamber 1. The substrate 10 is provided with a pair of electrodes (designated as 24 and 24' in FIG. 2) for measuring electric conductivity. To this electrodes can be made contacts with a pair of probes 17 and 17' from outside after formation of a semiconductor layer for making it possible to measure in situ the conductivity of the semiconductor in the presence of light and the conductivity in the absence of light, without making contact with atmospheric air.

The substrate 10' can be transported togather with the heater 12' between the first and second chambers 1 and 2 through the gate valve 3. The second pre-stage chamber 2 is provided with a cryosorption pump 6 through a second gate valve 5 and a turbo molecular pump 8 through a third gate valve 7. After placing the heater 12' on which the substrate 10' is held in the first chamber 1, the turbomolecular pump 8 is driven to evacuate the interiors of the first and second chambers 1 and 2 with the gate valves 3 and 7 opened and the gate valves 5 and 4 closed. When a pressure of $10^{-6}$ torr or less has been attained in the chambers 1 and 2, the heater 12' with the substrate 10' are transported from the first chamber 1 to the second chamber 2 by means of a first transportation mechanism 19. Then the interior of the second chamber 2 is further evacuated to the order of $10^{-10}$ torr with the gate valves 3 and 7 closed and the gate valve 5 opened by means of the cryosorption pump 6.

Upon making the interior of a reaction chamber 11 evacuated to a vacuum of $10^{-9}$ to $10^{-10}$ torr by a second cryosorption pump 9 connected to the reaction chamber 11 through a gate valve 22, the substrate 10 on the heater 12 is transported from the second pre-stage chamber 2 to the reaction chamber 11 by means of a second transportation mechanism 19' through a gate valve 4 opened. Then the valve 4 is closed and between a pair of electrodes 14 and 15 are taken place plasma discharge supplied with power from a high frequency voltage supply 13 to carry out a plasma CVD method on the substrate 10. Concurrent with the plasma discharge, light irradiation may be carried out by irradiating the interior of the reaction chamber 11 with an excimer laser or the like through a window 12.

In the figure, although two sets of substrates 10 and 10' and heater 12 and 12' appear, this is made only to expedite explanation and understanding the embodiment and practically there is one set alone of course.

The reactive gas for the plasma CVD method is introduced from a doping system 21 to the interior of the reactive chamber 11. The pressure of the reaction chamber is kept suitable for carrying out the CVD method optimally by the turbo molecular pump 9.

The pressure in the reaction chamber 11 is kept at 0.001 to 0.1 torr, normally at 0.05 to 0.1 torr. By virtur of high frequency energy, e.g., of 13.56 HMz and 10 watt, applied from the power supply 13, a nonmonocrystalline semiconductor film, an amorphous silicon doped with hydrogen in this embodiment, is formed according to the plasma CVD processing. For example, a nonmonocrystalline semiconductor layer of thickness $0.6\mu$ which is doped or not doped with p-type or n-type impurities is formed on the substrate 10 at 250° C. (or less than 500° C.).

The reactive gas and a carrier gas should be purified to the level in which the inclusive rates of oxygen and water are reduced to less than 0.1 ppm, more preferably to less than 1 ppb before introduction to the reactive chamber 11 in order to reduce the minimum oxygen density in the semiconductor less than $5 \times 10^{18}$ cm$^{-3}$, more preferably less than $1 \times 10^{18}$ cm$^{-3}$. As such a reactive gas, silane can be employed which is highly purified by a liquefaction purification for fabrication of silicon film.

In case where a photoelectric cell is to be formed, highly doping is suitable. To make a p-type semiconductor, the silane gas is dosed with diborane at 500 to 5000 ppm. To make a n-type semiconductor the silane gas is dosed with phosphin at about 5000 ppm. The impurities are introduced from a inlet port 21''.

Upon completion of the forming the semiconductor layer 26, the supply of the reactive gas is interrupted and the residue in the reaction chamber 11 is eliminated.

Then oxygen, fluorine, chlorine or nitrogen is introduced as a neutralizer agent from the doping system 25 to the first pre-stage chamber 1.

After evacuating the reaction chamber 11 by the turbo molecular pump 9, the substrate 10 on the heater 12 is transported from the reaction chamber 11 to the first pre-stage chamber 1 through the second pre-stage chamber 2 with the gate valves 3 and 4 opened. Then, with the gate valve 4 closed and the gate valve 5 opened, the pressure in the first pre-stage chamber 1 is kept at a prescribed vacuum by the cryosorption pump 6. The vacuum may be less than $10^{-3}$ torr, preferably $10^{-6}$ to $10^{-9}$ torr. In the pre-stage chamber 1, the semiconductor 10 is in atmosphere at less than 50° C. so that it does not experience thermal annealing, and is irradiated with light without making contact with air. By such a light irradiation, dangling bonds on the semiconductor are made to appear and thereafter neutralized by the neutralizing agent such as fluoride, chloride, oxygen, nitrogen, argon, krypton, xenon, helium or hydrogen and then the semiconductor fablication is now completed. In case that fluoride introducing is desired as neutralization, use of fluoride gas of purity 99% or higher is suitable as an agent.

Namely, fluoride (m.p. $-223°$ C., v.p. $-187$ C.) retained in a vessel is liquefied by liquefied nitrogen. Then, the liquefied fluoride is vaporized under vacuum and purified as a very highly purified fluoride. In virtue of this processing, the fluoride is estimated to have higher than 99.99% purity with very few oxygen having a dew point lower than $-60°$ C.

Thus introduced fluoride permeates into the surface, caves, gaps or the like and neutralizes the dangling bonds of the semiconductor made appear by the photo annealing. In addition to replacing Si-F bindings for dangling bonds Si-, the fluoride replaces Si-F bindings also for Si-H bindings which have relatively weak binding force.

Figure 2:
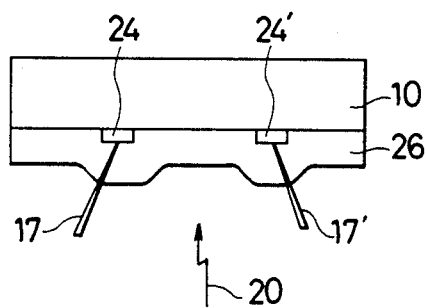
FIG. 2 is a cross section view showing a method for measuring the electric conductivity of a semiconductor according to the embodiment of the invention.

FIG. 2 showes the semiconductor layer 26 on the substrate 10 fabricated as in the above. The substrate 10 is made of a synthetic quartz. The semiconductor layer 26 is made of an nonmonocrystal amorphous silicon doped with hydrogen or halogen.

For the semiconductor layer 10, light irradiation annealing and thermal annealing are repeated for examining the change of the conductivity of the semiconductor layer 10. The thermal annealing is carried out with halogen light (100mW/cm$^2$) and the photo annealing is carried out supplying power from the heater. The measuring of the conductivity is accomplished by means of the pair of proves 17 and 17' respectively in contact with the pair of electrodes 24 and 24' in situ, namely at a vacuum.

In advance of describing the experimental result of measuring the conductivity of a semiconductor formed by the device according to the invention, a brief explanation of prior art will be made for reference.

Figure 3:
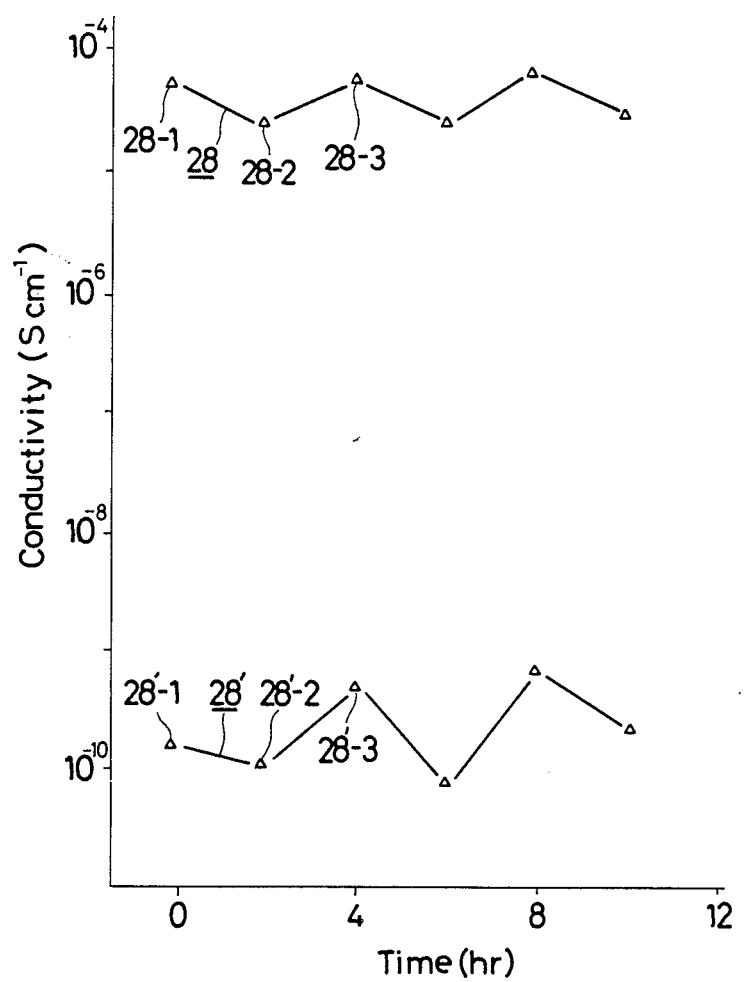
FIG. 3 is a graphical diagram showing the electric conductivity characteristic of a prior art intrinsic semiconductor.

FIG. 3 showes the trend of the conductivity of a conventional semiconductor undergoing thermal annealing and photo annealing in turn in atmospheric circumference. As the conventional semiconductor a silicon semiconductoe layer of 0.6μ thickness formed on a quartz glass pane was measured.

In the following, the conductivity in presence of light (from a xenon lamp) is referred to as a photo conductivity and the conductivity in absence of light is referred to as a dark conductivity.

In the figure, the initial photo conductivity is designated as 28-1, and the initial dark conductivity as 28'-1. Light of AM1(100mW/cm$^2$) is radiated from a xenon lamp to the semiconductor layer and as a result photo and dark conductivities 29-2 and 29'-2 were measured showing decreases from the initial levels. Then, themal annealing is carried out, for this layer, at 150° C. for 2 hours, and thereafter conductivity is measured, the result being seen in the figure with 28-3 and 28'-3 showing increases from the preceding levels. In this manner, thermal and photo annealings are repeated one after another. As a result, Staebler-Wronski effect is demonstrates as shown in FIG. 3, in which both the photo and dark conductivities are decreased by photo annealing and recovers by virtue of thermal annealing with repeatedly.

Referring now to FIGS. 4 through 8 the transition of the conductivity of the semiconductor manufactured by the device of the invention is shown in response to optical and thermal annealings carried out one after another as in the above. On the curves, measurement results are designated by 29-1, 29-2, indicating the ordinal number of measurement and the apostrophe indicating the absence of light as like in FIG. 3.

Figure 4:
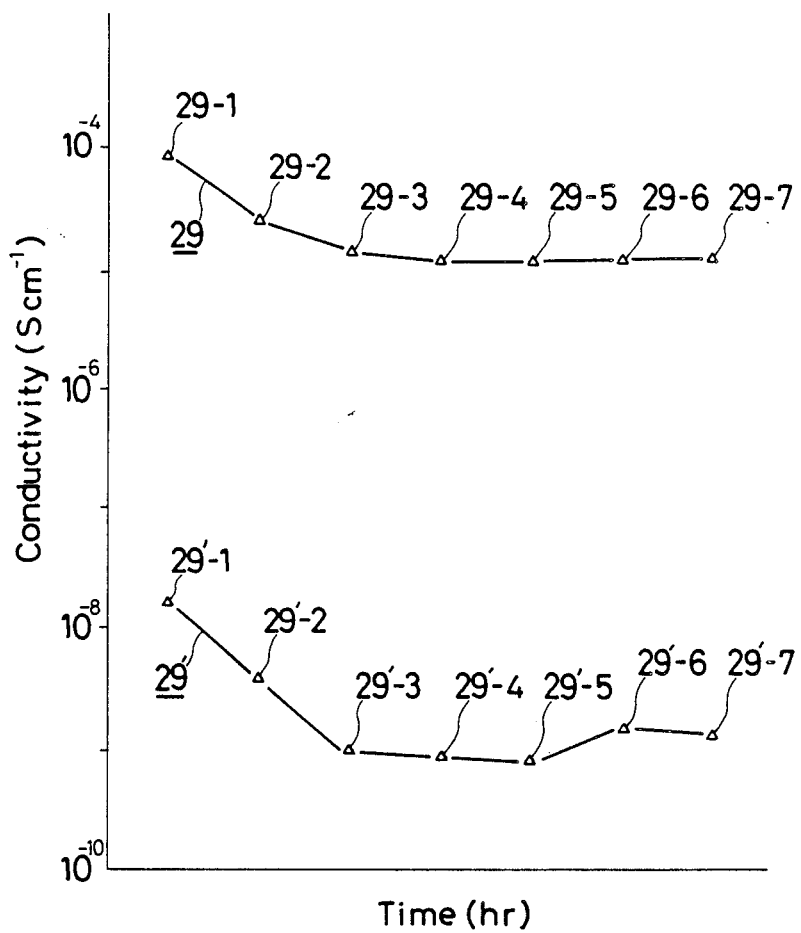
FIGS. 4, 5, 6, 7 and 8 are graphical diagrams showing electric conductivity characteristic of semiconductors formed by a semiconductor manufacturing device according to the invention.

FIG. 4 is a graphcal diagram showing the conductivity of a semiconductor formed by the device of the invention without treatment with the neutralizing agent. As described above, the measurings were made in the pre-stage chamber 1 under vacuum without making contact with air.

On initial measuring, a dark conductivity 29-1, $1.5 \times 10^{-8}$ Scm$^{-1}$ and a photo conductivity 29'-1, $9 \times 10^{-5}$ Scm$^{-1}$ are obtained at 25° C., and $4 \times 10^{-8}$ torr. Thereafter the semiconductor underwent photo annealing for two hours at 100 mW/cm$^2$ by a xenon lamp. A dark conductivity 29-2, $6 \times 10^{-9}$ Scm$^{-1}$, and a photo conductivity 29'-2, $3.5 \times 10^{-5}$ Scm$^{-1}$ are obtained indicating decreases from the initial levels like the prior art. Next, the semiconductor underwent thermal annealing for 3 hours at 150° C. Unexpectedly, as a result, the conductivity further decreased unlike conventional measuring. This phenomenon discovered by the inventors has been named SEL effect. Meanwhile, although "SEL" corresponds to the abbreviation of the assignee's name, this SEL was derived rather from "State Exited by Light". The reason why SEL effect takes place instead of Staebler-Wronski effect is supposed because dangling bonds of the semiconductor are remain as they are during repetition in the evacuated chamber.

Figure 5:
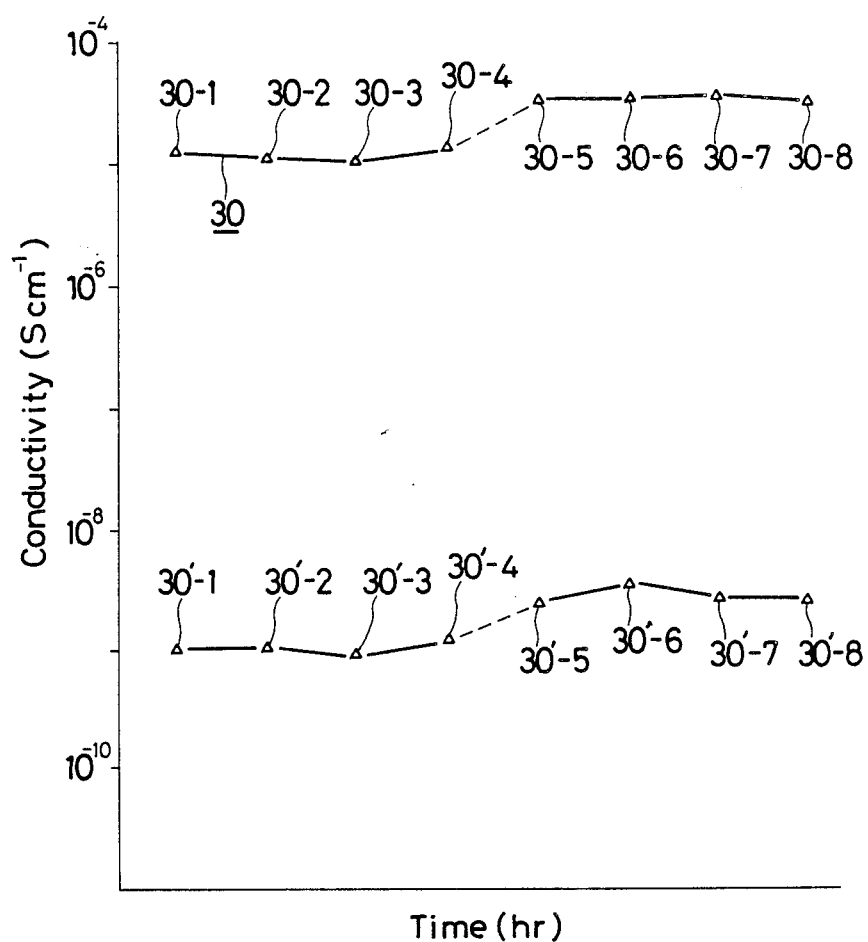

FIG. 5 showes a conductivity of the semiconductor measured in situ in the device on the invention in which oxygen was introduced at $4 \times 10^4$ Pa, approximately same as the partial pressure of oxygen in air, into the first pre-stage chamber as a neutralizing agent. 30-1 and 30'-1 designate the photo and dark conductivities respectively before the introduction of oxygen. 30-2 and 30'-2 designate the photo and thermal conductivities respectively after the introduction. After the measurement 30-2 and 30'-2, the semiconductor is irradiated with light from the halogen lamp at 100 W/cm² for two hours. As a result the conductivities 30-3 and 30'-3 were recognized to remain roughly as they were, although a slight decrease was observed. Next after thermal annealing for 3 hours at 150° C. the conductivity slightly recovered to 30-4, $1.3 \times 10^{-5}$ Scm$^{-1}$, and 30'-4, $1.2 \times 10^{-9}$ Scm$^{-1}$. Further, this semiconductor was left at negative pressure for a week. And, the conductivity was measured again and substantial increase was evaluated. Although the inventors repeated optical annealing for 2 hours and thermal annealing for 3 hours at 150° C. one after another, apprecable change was not observed in the conductivity as shown with 30-6, $2.5 \times 10^{-5}$; 30'-6, $3 \times 10^{-9}$; 30-7, $2.7 \times 10^{-5}$; 30'-7, $2.3 \times 10^{-9}$. This trend can be explained as infra.

Namely, after sufficiently producing dangling bonds as recombination centers by virtue of light irradiation under vacuum, the dangling bonds are neutralized by oxygen or other neutralizer introduced and the adverse recombination centers are largely decreased which impair stabilization of the semiconductor. Once neutralized, the dangling bonds can not recover, even with photo annealing.

Further the semiconductor thus measured was taken out of the device and subjected to measuring in the same manner as the above in the atmospheric circumference. However no Staebler-Wronski effect was demonstrated (30-8, and 30'-8).

Consequently, it was proved that with the device according to the invention can be manufactured very stable semiconductor devices.

Figure 6:
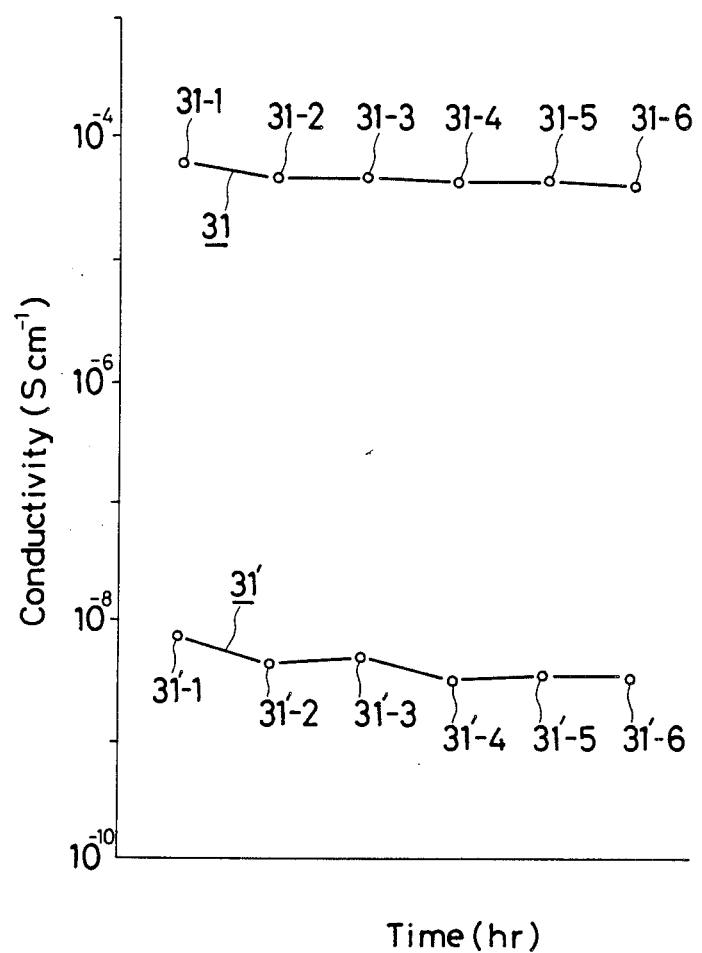

FIG. 6 show another example of the transition of the conductivity of a semiconductor neutralized by a neutralizer agent.

In this example, before measurement the semiconductor was irradiated with light for 48 hours or at least more than 3 hours so that sufficient number of dangling bonds appeared, and highly purified fluoride gas was introduced into the pre-stage chamber in order to neutralize the dangling bonds according to the fomula

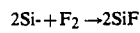

2Si·+F$_2$ →2SiF

The Si-F binding is expected stable even in the atmospheric air. The electronegativity of fluoride is 4.0 while the electronegativity of oxide is 3.5. Thus, the repetation of photo and thermal annealings were carried out for the semiconductor in the same condition as described above with FIG. 3. As seen from FIG. 6, the conductivity substantially did not fluctuate. From this experiment few recombination center appears anew according on the semiconductor.

Figure 7:
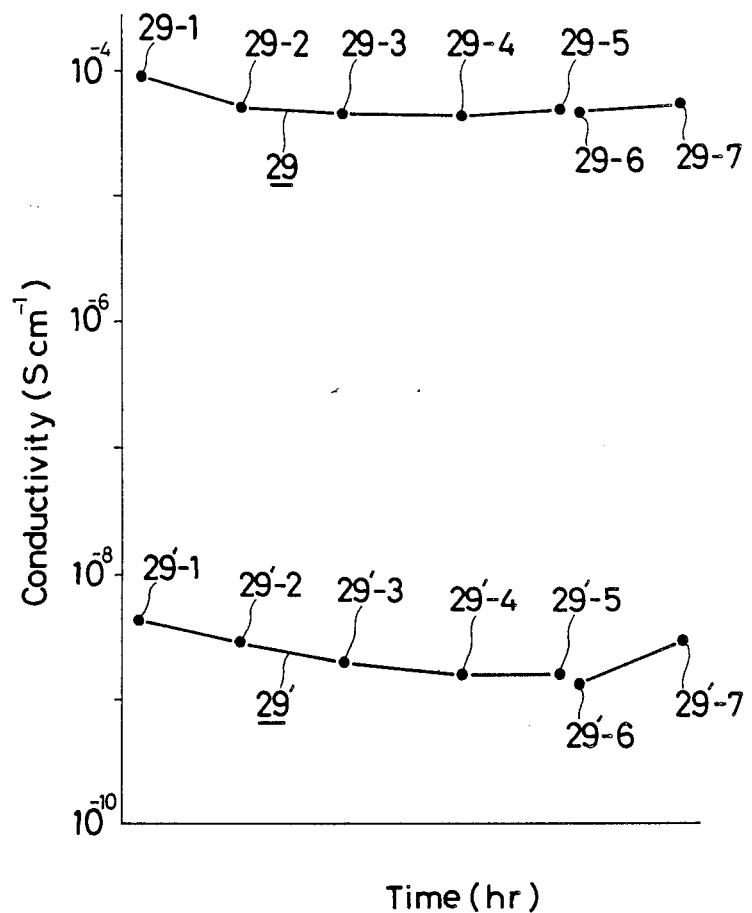

Referring to FIG. 7, the conductivity of further embodiment is shown. In this example, measuring results 29-1 to 29-5, and 29'-1 to 29'-5 are obtained in the same condition and the same specimen as in the FIG. 4. After measuring 29-5, and 29'-5, argon gas was introduced into the pre-stage chamber and rendered connected to dangling bonds which reside on the surface, caves or holes of the semiconductor. Then, as described above, SEL effect was observed in atmospheric pressure and in low pressure ($10^{-2}$ to $10^{-6}$ torr). Thereafter, the semiconductor was treated with a thermal annealing at 100 to 500° C. in an ambience of the argon excited by ultraviolet light. The conductivity of the semiconductor thus treated is shown by 32-1 and 32'-1. For this semiconductor, the repetition of photo and thermal annealings were carried out in turn as foregoing embodiment.

Figure 8:
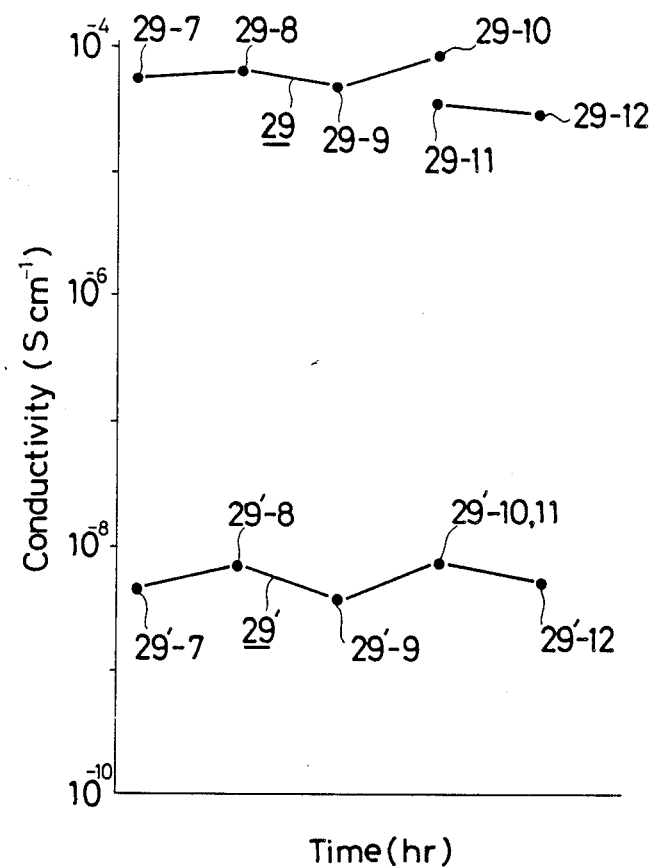

As shown in FIG. 8, fluctuation by Staebler-Wronski effect was largely limited in comparison with prior art.

In the further embodiment, krypton, xenon, helium, hydrogen or blends thereof are effectively used instead of argon and, in addition, existence of a trace quantity of sodium is very advantageous for stability of the characteristic of the semiconductor.

The recombination center density in a semiconductor according to the invention is estimated less than $1 \times 10^{17\ to\ 18}$ cm$^{-3}$, in some cases, less than $5 \times 10^{16}$.

Though the above invention has been described with respect to specific preferred embodiments thereof, many variations and modifications can be applied as follow.

The neutralization process can be carried out in another chamber prepared separate from the manufacturing device.

After being irradiated, the semiconductor can be thermally processed at 100 to 500° C., more desirably 250 to 300° C., at ambient pressure in the atmosphere of fluoride mixture made active by ultraviolet light radiation. For this semiconductor thus processed, almost same characteristic as shown in FIG. 6 was observed.

The present invention is also applicable to semiconductor layers which are fabricated by photo CVD method.

Besides amorphous silicon, $Si \times C_{1-x}(0 < X < 1)$, $Si_xSn_{1-x}$ $(0 < X < 1)$, $Si_xGe_{1-x}(0 < X < 1)$, in which hydrogen and/or fluoride is doped, or amorphous silicon fluoride or other nonmonocrystalline semiconductor can be applied the invention for.

As neutralizer agent, fluoride such as HF, CHF$_3$, CH$_2$F$_2$, CF$_4$, GeF$_4$, Si$_2$F$_6$ or so on, and chloride such as HCl, CHCl$_3$, CH$_2$Cl$_2$, CCl$_2$F$_2$, or so on can be employed with irradiation of ultraviolet light. Also oxide can be used in cooperation with ultraviolet light whic decomposes the oxide into atoms.

As easily understood, additives utilized in the invention as neutralizer are entirely different from that of prior art, for example, described in U.S. Pat. No. 4,226,898 in which these additives are introduced simultaneously with fabricating process of a semiconductor carring out in the ambience of reactive gas including impurities.

What is claimed is:

1. A semiconductor manufacturing apparatus comprising:
   a film forming chamber including means for depositing semiconductor film on a substrate;
   a first separate chamber provided with a lamp capable of photo annealing said semiconductor film whereby the substrate may be transported without making contact with air to the inside of said first separate chamber so that said lamp can effect said photo annealing of the films in the absence of air in a vacuum of less than $10^{-3}$ Torr;
   a cryosorption pump capable of establishing said vacuum in the first separate chamber; and
   means capable of neutralizing dangling bonds in the photo annealed semiconductor film with a gaseous neutralizer.

2. A semiconductor manufacturing apparatus comprising:
   a film forming chamber including means for depositing semiconductor film on a substrate;
   a first separate chamber provided with a lamp capable of photo annealing said semiconductor film whereby the substrate may be transported without making contact with air to the inside of said first chamber so that said lamp can effect said photo annealing of the films in the absence of air in a vacuum of less than $10^{-3}$ Torr;

a turbo-molecular pump capable of establishing said vacuum in the first chamber; and means capable of neutralizing dangling bonds in the photo annealed semiconductor film with a gaseous neutralizer.

3. A semiconductor manufacturing apparatus comprising:

a film forming chamber including means for depositing semiconductor film on a substrate;

a first chamber provided with a lamp capable of photo annealing said semiconductor film whereby the substrate may be transported without making contact with air to the inside of said first chamber so that said lamp can effect said photo annealing of the films in the absence of air in a vacuum of less than $10^{-3}$ Torr;

a cryosorption pump capable of establishing said vacuum in the first chamber;

a turbo-molecular pump capable of establishing said vacuum in the first chamber;

means for selecting one or both of said cryosorption pump and said turbo-molecular pump to establish said vacuum in the first chamber; and means capable of neutralizing dangling bonds in the photo annealed semiconductor film with a gaseous neutralizer.

4. The apparatus of claims 1, 2, or 3 further comprising a second separate chamber including a vacuum chamber and through which said first separate chamber is joined to said film forming chamber, said separate chamber being adapted for exclusive use of providing a middle pressure region through which the substrate can be transported from a low vacuum space in said first separate chamber to a high vacuum space in said film forming chamber.

5. The apparatus of claims 1, 2, or 3 wherein said photo annealing is carried out by a xenon lamp.

* * * * *